(12) United States Patent
Na

(10) Patent No.: US 11,081,276 B2
(45) Date of Patent: Aug. 3, 2021

(54) ELECTRONIC COMPONENT

(71) Applicant: SAMSUNG ELECTRO-MECHANICS CO., LTD., Suwon-si (KR)

(72) Inventor: Jae Young Na, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/114,905

(22) Filed: Aug. 28, 2018

(65) Prior Publication Data

US 2019/0259533 A1    Aug. 22, 2019

(30) Foreign Application Priority Data

Feb. 19, 2018 (KR) .................. 10-2018-0019408

(51) Int. Cl.
*H01G 4/005* (2006.01)
*H01G 4/38* (2006.01)
*H01G 4/33* (2006.01)
*H01G 4/30* (2006.01)
*H01G 4/12* (2006.01)
*H01L 49/02* (2006.01)

(52) U.S. Cl.
CPC .............. *H01G 4/005* (2013.01); *H01G 4/30* (2013.01); *H01G 4/33* (2013.01); *H01G 4/38* (2013.01); *H01L 28/86* (2013.01); *H01G 4/12* (2013.01)

(58) Field of Classification Search
CPC ............ H01G 4/30; H01G 4/228; H01G 4/38; H01G 4/005; H01G 4/33; H01G 4/12; H05K 1/181; H01L 28/86

USPC ............ 361/321.1, 306.3, 306.1, 306.2, 328, 361/301.4, 321.2, 321.3, 330
See application file for complete search history.

(56) References Cited

U.S. PATENT DOCUMENTS

| 9,025,311 B1* | 5/2015 | Bultitude ............... H01G 4/38 361/321.2 |
| 2011/0228445 A1* | 9/2011 | Abe .................... H01G 4/38 361/328 |
| 2013/0094122 A1* | 4/2013 | Domes ............... H05K 7/1432 361/321.1 |
| 2015/0187502 A1 | 7/2015 | Hwang |

(Continued)

FOREIGN PATENT DOCUMENTS

| KR | 101545410 B1 | 8/2015 |
| KR | 101702398 B1 | 2/2017 |

*Primary Examiner* — Arun Ramaswamy
(74) *Attorney, Agent, or Firm* — Morgan, Lewis & Bockius LLP

(57) ABSTRACT

An electronic component includes: a first frame, including a first support portion and a plurality of first extension portions, extended from the first support portion in a first direction; a second frame, including a second support portion disposed to face the first support portion and a plurality of second extension portions, extended from the second support portion in a second direction opposite to the first direction and disposed to alternate with and be spaced apart from the first extension portions in the first direction; and a plurality of capacitors disposed on first and second extension portions adjacent to each other by a predetermined interval so that first and second external electrodes are adhered thereto, respectively.

6 Claims, 10 Drawing Sheets

(56) References Cited

U.S. PATENT DOCUMENTS

2015/0325376 A1\* 11/2015 Fujii .................. H01G 4/38
323/304

\* cited by examiner

ELECTRONIC COMPONENT

CROSS-REFERENCE TO RELATED APPLICATION(S)

This application claims the benefit of priority to Korean Patent Application No. 10-2018-0019408 filed on Feb. 19, 2018, in the Korean Intellectual Property Office, the disclosure of which is incorporated herein by reference in its entirety.

TECHNICAL FIELD

The present disclosure relates to an electronic component.

BACKGROUND

As high capacitance, high voltage resistance, and high reliability have been required in capacitors for industrial and electric fields, an electrolytic capacitor, a film capacitor, or the like, has been used.

However, since such products have low thermal stability, there is a need to provide a separate cooling device, which may increase costs.

Therefore, in market research, an attempt to attach a plurality of multilayer capacitors, that are thermally stable, to each other, to have high capacitance, in order to replace the above-mentioned products, has been reported.

However, in a case of applying a multilayer capacitor that is thermally stable, an expensive cooling device may be omitted, but this means an increase in costs of the multilayer capacitor.

Therefore, a simple and reliable assembly process for such a multilayer capacitor may bring high added value, and a method capable of simply and reliably attaching a plurality of multilayer capacitors has been required.

Among electronic components composed of multilayer capacitors according to the related art, there is a product having a structure in which a plurality of multilayer capacitors are stacked using a frame.

However, since in most of the products as described above, a stacking direction of the multilayer capacitors is determined to be one of longitudinal and transverse directions, the product has a shape in which the product is formed to be entirely elongated in only one of the longitudinal and transverse directions, such that stability may be deteriorated.

SUMMARY

An aspect of the present disclosure may provide an electronic component having excellent stability by attaching a plurality of multilayer capacitors to each other to constitute a single product.

According to an aspect of the present disclosure, an electronic component may include: a first frame, including a first support portion and a plurality of first extension portions, extended from the first support portion in a first direction; a second frame, including a second support portion disposed to face the first support portion and a plurality of second extension portions, extended from the second support portion in a second direction opposite to the first direction and disposed to alternate with and be spaced apart from the first extension portions in the first direction; and a plurality of multilayer capacitors disposed on first and second extension portions adjacent to each other by a predetermined interval so that first and second external electrodes are connected thereto, respectively.

The plurality of multilayer capacitors may be disposed to face each other in two layers with the first and second frames interposed therebetween.

The electronic component may further include a sealing part covering the plurality of multilayer capacitors.

A first extension portion positioned in an outermost portion of the first frame may be bent along side and lower surfaces of the sealing part to thereby become a first terminal, and a second extension portion positioned in an outermost portion of the second frame may be bent along the side and lower surfaces of the sealing part to thereby become a second terminal.

The first and second frames may not be formed on portions diagonally opposing each other in both surfaces of the sealing part in a length direction.

The multilayer capacitor may include a body including first and second internal electrodes stacked to be alternately exposed to both surfaces of the body in a length direction, wherein the first and second internal electrodes are connected to the first and second external electrodes, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
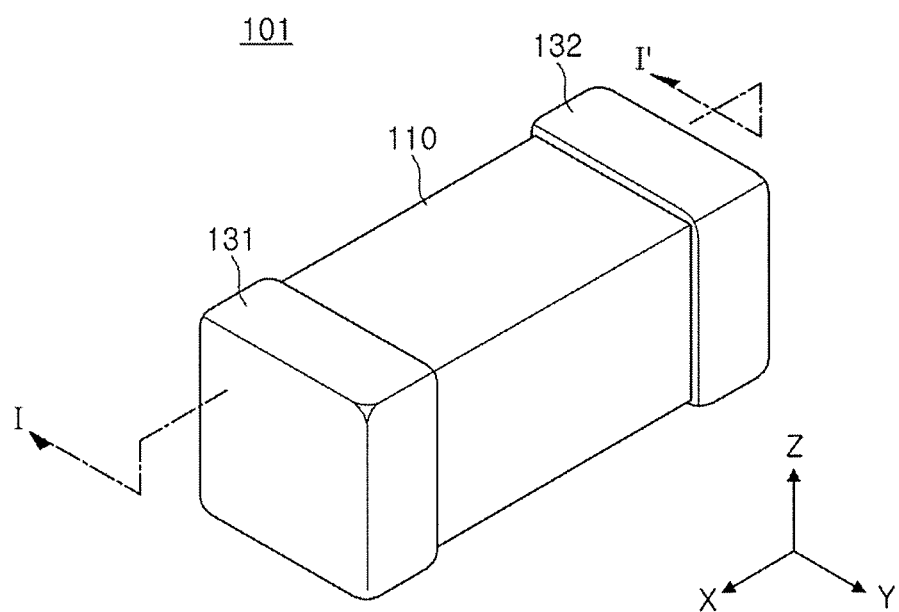
FIG. 1 is a perspective view schematically illustrating a multilayer capacitor applied to an electronic component according to an exemplary embodiment in the present disclosure.

Hereinafter, exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Directions of a multilayer capacitor will be defined in order to clearly describe exemplary embodiments in the present disclosure. X, Y and Z illustrated in the accompanying drawings refer to a length direction, a width direction, and a thickness direction, respectively. Here, the thickness direction may be the same as a stacking direction in which dielectric layers are stacked in the multilayer capacitor.

Further, for convenience of explanation, surfaces of a body opposing each other in the Z direction will be defined as first and second surfaces, and surfaces of the body opposing each other in the X direction will be defined as third and fourth surfaces.

Terms used herein are used only in order to describe an exemplary embodiment rather than limiting the present disclosure. In this case, singular forms include plural forms unless interpreted otherwise in context.

Multilayer Capacitor

Figure 2:
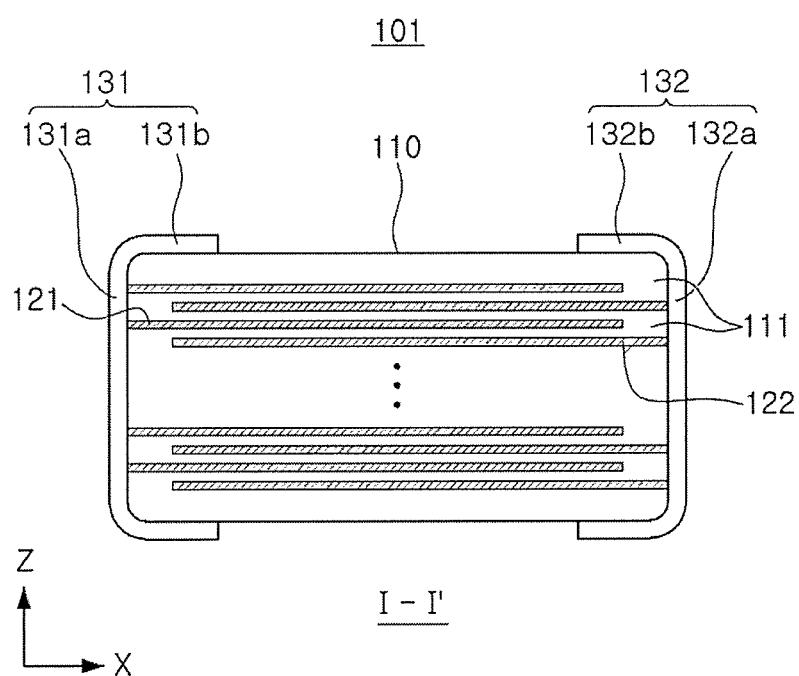
FIG. 2 is a cross-sectional view taken along line I-I' of FIG. 1.

FIG. 1 is a perspective view schematically illustrating a multilayer capacitor of an electronic component according to an exemplary embodiment in the present disclosure, and FIG. 2 is a cross-sectional view taken along line I-I' of FIG. 1.

Referring to FIGS. 1 and 2, a multilayer capacitor 101 according to the present exemplary embodiment may include a body 110; and first and second external electrodes 131 and 132.

The body 110 may be formed by stacking a plurality of dielectric layers 111 in the Z direction and sintering the stacked dielectric layers 111. In this case, a shape and a dimension of the body 110 and the number of stacked dielectric layers 111 may be variously changed and are not limited to those illustrated in the present exemplary embodiment.

In addition, the plurality of dielectric layers 111 constituting the body 110 may be in a sintered state, and adjacent dielectric layers 111 may be integrated with each other so that boundaries therebetween are not readily apparent without a scanning electron microscope (SEM).

Further, the body 110 may include an active region as a portion contributing to forming capacitance of the capacitor and upper and lower covers disposed on upper and lower surfaces of the active region as upper and lower margin portions, respectively.

The active region may be formed by repeatedly stacking the plurality of first and second internal electrodes 121 and 122 with each of the dielectric layers 111 interposed therebetween in the Z direction.

In this case, a thickness of the dielectric layer 111 may be suitably changed according to a capacitance design of the multilayer capacitor 101.

Further, the dielectric layer 111 may contain ceramic powder having high permittivity such as barium titanate ($BaTiO_3$) based powder or strontium titanate ($SrTiO_3$) based powder. However, a material of the dielectric layer 111 is not limited thereto.

The upper and lower covers may have the same material and configuration as those of the dielectric layer 111 except that the internal electrodes are not included therein.

The upper and lower covers may be formed by stacking a single or two or more dielectric layers on the upper and lower surfaces of the active region in the thickness direction, respectively, and basically serve to prevent the first and second internal electrodes 121 and 122 from being damaged by physical or chemical stress.

The first and second internal electrodes 121 and 122, which are electrodes having different polarities from each other, may be formed by printing a conductive paste containing a conductive metal on the dielectric layers 111 at a predetermined thickness.

In this case, the conductive metal contained in the conductive paste may be, for example, nickel (Ni), copper (Cu), palladium (Pd), or an alloy thereof. However, the conductive metal is not limited thereto.

Further, as a printing method of the conductive paste, for example, a screen printing method, a gravure printing method, or the like, may be used. However, the printing method is not limited thereto.

The first and second internal electrodes 121 and 122 may be alternately stacked in the body 110 to face each other in the stacking direction of the dielectric layers 111.

Therefore, the first and second internal electrodes 121 and 122 may be disposed to be alternately exposed to both surfaces of the body 110 in the X direction, with each of the dielectric layers 111 interposed therebetween. In this case, the first and second internal electrodes 121 and 122 may be electrically insulated from each other by the dielectric layer 111 disposed therebetween.

Further, portions of the first and second internal electrodes 121 and 122 alternately exposed to both end surfaces of the body 110 in the X direction may mechanically come in contact with first and second connection portions of first and second external electrodes 131 and 132 to be described below, respectively, such that the first and second internal electrodes 121 and 122 may be electrically connected to the first and second external electrodes 131 and 132, respectively.

Therefore, when voltage is applied to the first and second external electrodes 131 and 132, electric charges are accumulated between the first and second internal electrodes 121 and 122 facing each other. In this case, capacitance of the multilayer capacitor 101 may be in proportion to an area of an overlapping region between the first and second internal electrodes 121 and 122 in the active region.

Further, a thickness of the first and second internal electrodes 121 and 122 may be determined according to the use thereof.

The first and second external electrodes 131 and 132 may be formed of a conductive paste containing a conductive metal.

Here, the conductive metal may be, for example, nickel (Ni), copper (Cu), palladium (Pd), gold (Au) or an alloy thereof. However, the conductive metal is not limited thereto.

The first and second external electrodes 131 and 132 as described above may include first and second connection portions 131a and 132a and first and second band portions 131b and 132b, respectively.

In the first and second external electrodes 131 and 132, the first and second connection portions 131a and 132a may be portions disposed on both surfaces of the body 110 in the X direction, respectively, and the first and second band portions 131b and 132b may be portions extended from the first and second connection portions 131a and 132a to portions of a lower surface of the body 110, a mounting surface of the body 110, respectively.

Here, the first and second band portions 131b and 132b may be further extended up to at least one surface of an upper surface of the body 110 and both surfaces of the body 110 in the Y direction.

In addition, although a case in which the first and second band portions 131b and 132b of the first and second external electrodes 131 and 132 are all extended from the first and second connection portions 131a and 132a to portions of the upper surface of the body 110 and both surfaces thereof in the Y direction to cover both end portions of the body 110 is described and illustrated in the present exemplary embodiment, the first and second band portions 131b and 132b are not necessarily limited thereto.

Electronic Component

Figure 3:
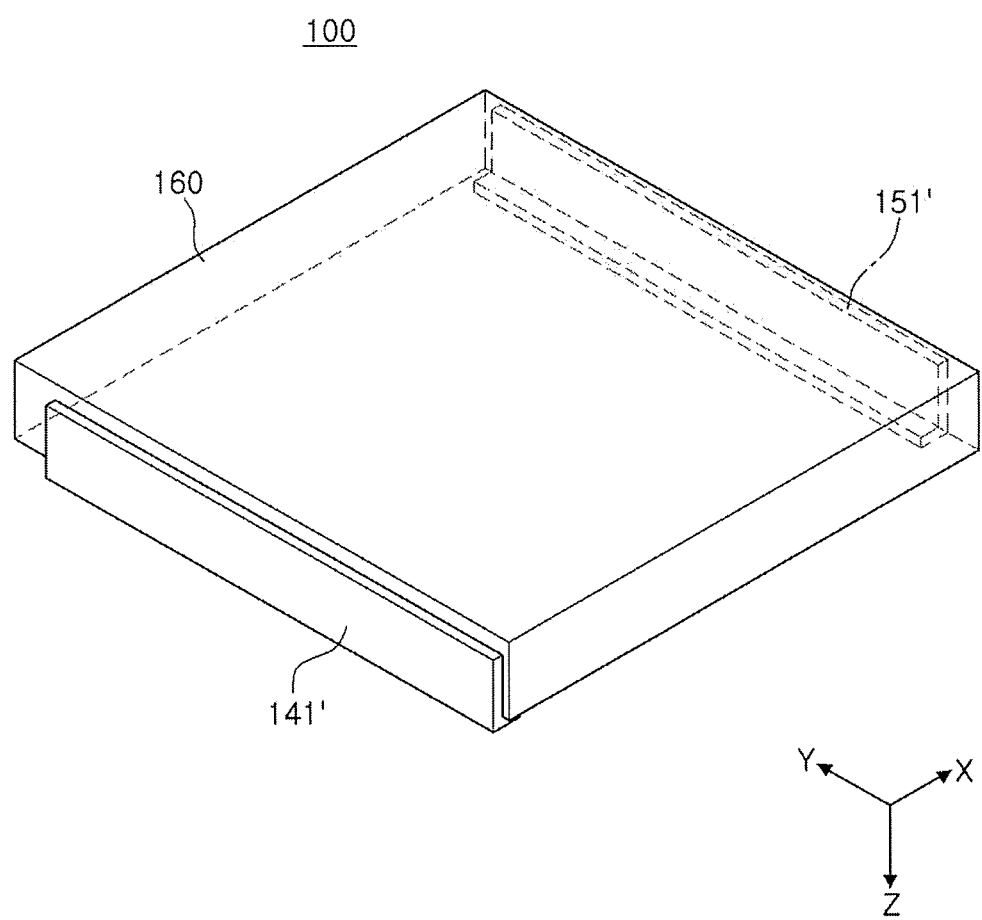
FIG. 3 is a perspective view of the electronic component according to the exemplary embodiment in the present disclosure.
Figure 4:
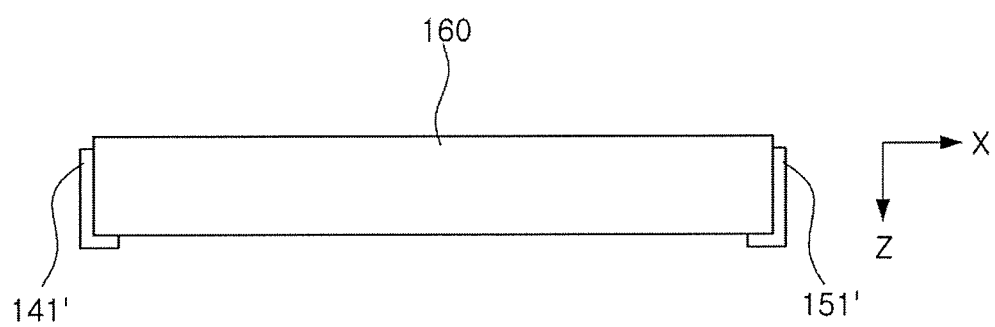
FIG. 4 is a front view of FIG. 3.
Figure 5:
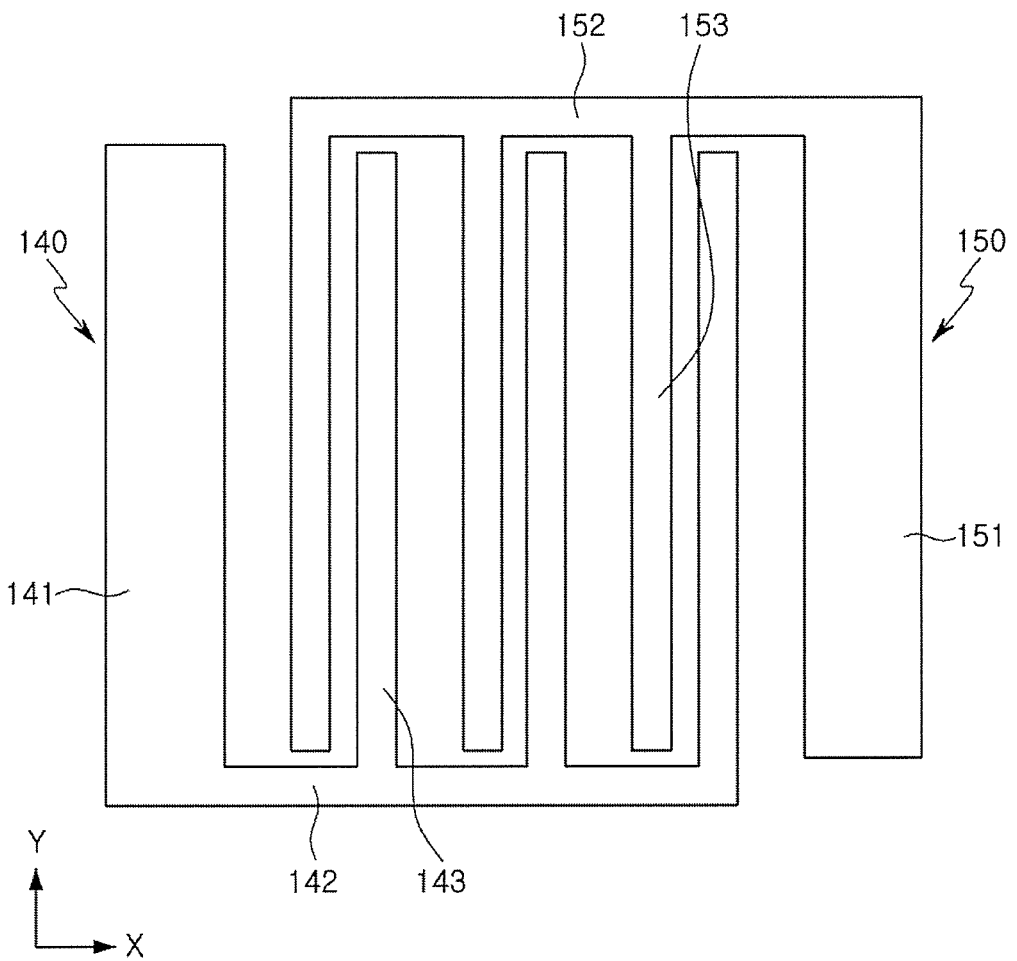
FIG. 5 is a plan view illustrating first and second frames of the electronic component of FIG. 3.
Figure 6:
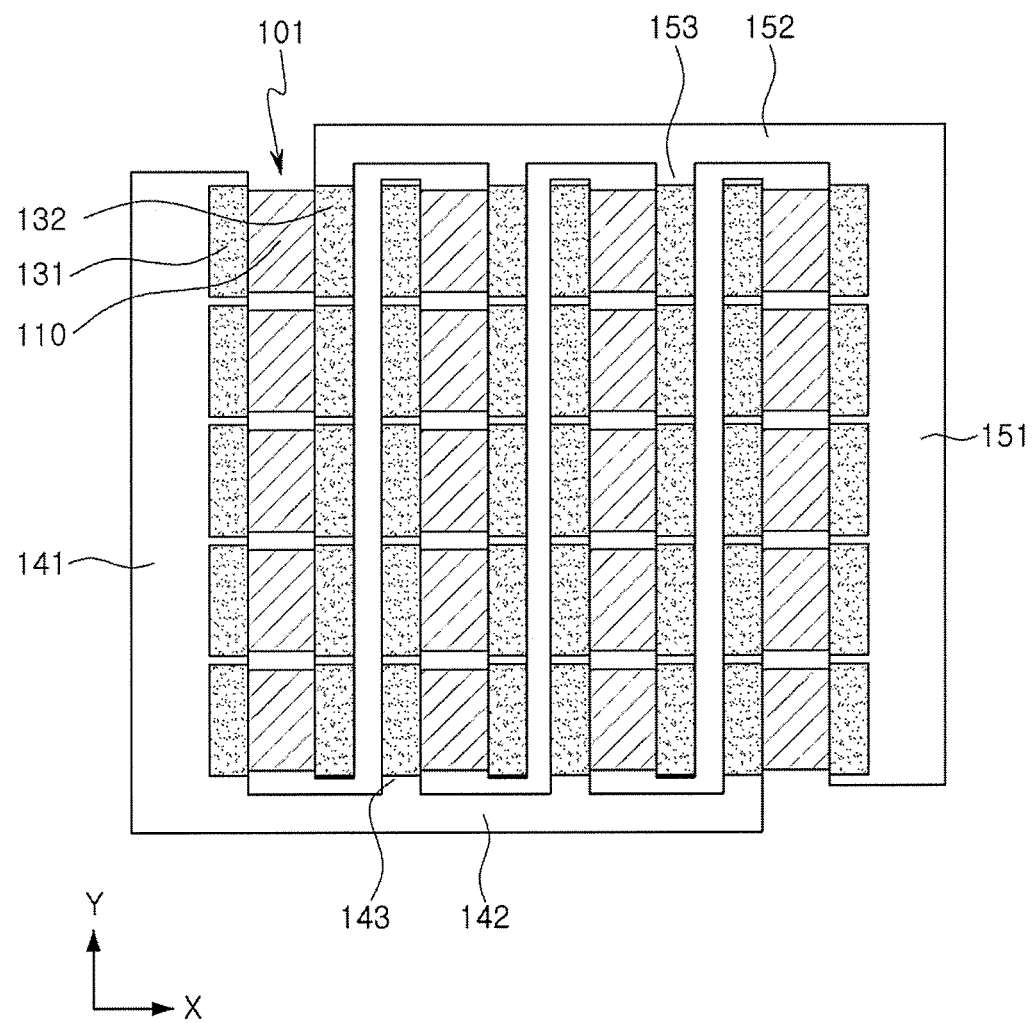
FIG. 6 is a plan view illustrating a state in which a plurality of multilayer capacitors are stacked on the first and second frames of FIG. 5.
Figure 7:
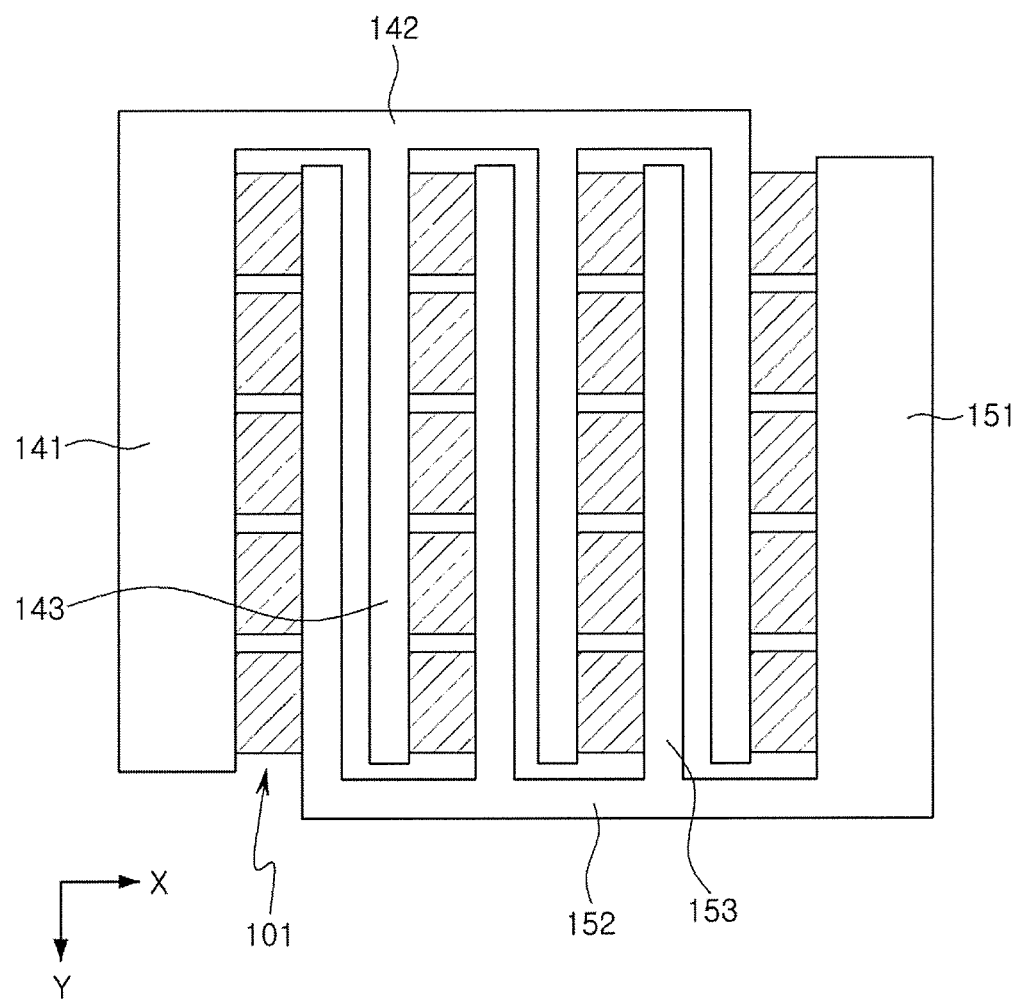
FIG. 7 is a plan view illustrating an overturned state of FIG. 6.
Figure 8:
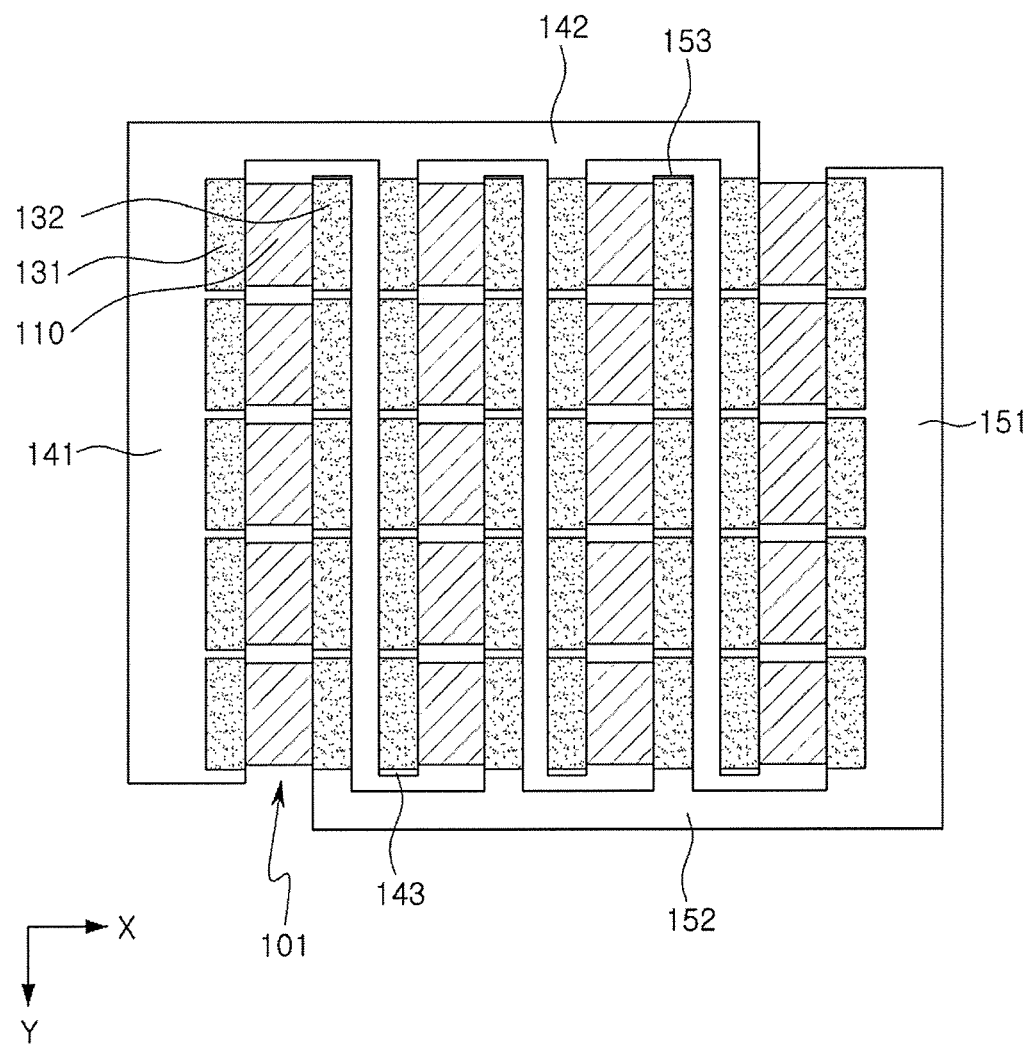
FIG. 8 is a plan view illustrating a state in which a plurality of multilayer capacitors are further installed on the first and second frames in the structure of FIG. 7.
Figure 9:
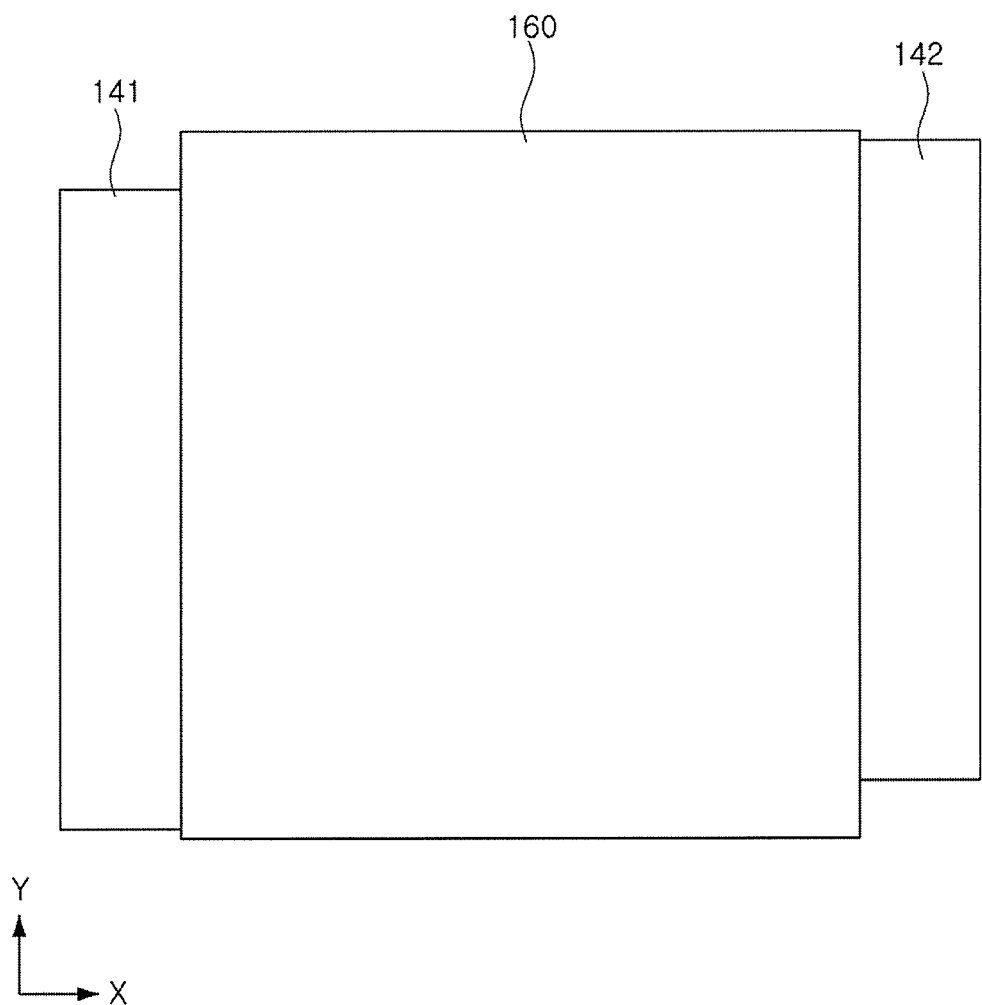
FIG. 9 is a perspective view illustrating a state in which a structure of FIG. 8 is overturned and a molding part is formed.
Figure 10:
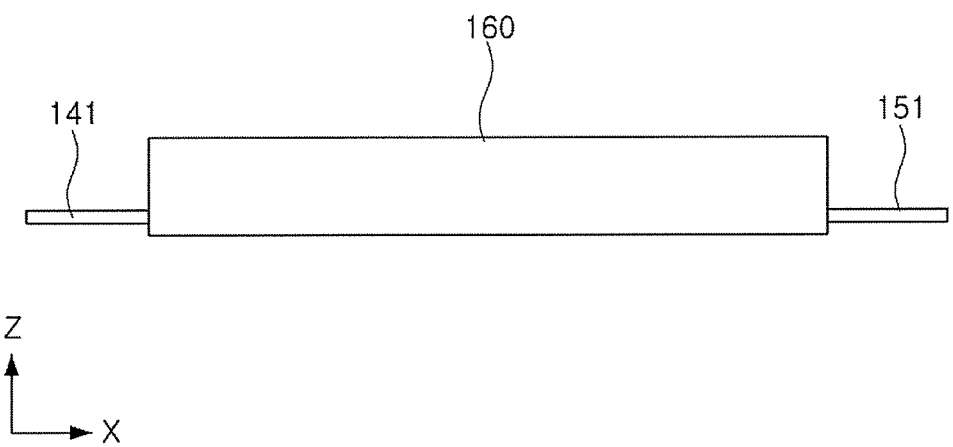
FIG. 10 is a plan view of FIG. 9.

FIG. 3 is a perspective view of the electronic component according to the exemplary embodiment in the present disclosure, FIG. 4 is a front view of FIG. 3, FIG. 5 is a plan view illustrating first and second frames of the electronic component of FIG. 3, FIG. 6 is a plan view illustrating a state in which a plurality of multilayer capacitors are stacked on the first and second frames of FIG. 5, FIG. 7 is a plan view illustrating an overturned state of FIG. 6, FIG. 8 is a plan view illustrating a state in which a plurality of multilayer capacitors are further installed on the first and second frames in the structure of FIG. 7, FIG. 9 is a perspective view illustrating a state in which a structure of FIG. 8 is overturned and a molding part is formed, and FIG. 10 is a plan view of FIG. 9.

Referring to FIGS. 3 through 10, the electronic component 100 according to the present exemplary embodiment may include a first frame 140, a second frame 150, and a plurality of multilayer capacitors 101.

Here, two or more multilayer capacitors 101 may be connected in parallel to each other by the first and second frames 140 and 150 to form a single capacitor set.

The first frame 140 may include a first support portion 142 formed to be elongated in the X direction and a plurality of first extension portions 141 and 143 extended from the first support portions 142 in a first direction of the Y direction by a predetermined interval to form a comb-tooth structure.

Here, among the first extension portions, a first extension portion 141 positioned at a left outermost portion in the X direction may serve as a first terminal connected to an external device such as a board, or the like.

The first frame 140 as described above may be formed of a conductive paste containing a conductive metal.

Here, the conductive metal may be, for example, nickel (Ni), copper (Cu), palladium (Pd), gold (Au) or an alloy thereof. However, the conductive metal is not limited thereto.

In this case, a nickel (Ni)/tin (Sn) plating layer or a gold (Au) plating layer may be formed on a surface of the first frame 140.

The second frame 150 may include a second support portion 152 disposed to face the first support portion 142 in the Y direction and formed to be elongated in the X direction, and a plurality of second extension portions 151 and 153 extended from the second support portion 152 in a second direction of the Y direction opposite to the first direction to form a comb-tooth structure. The second extension portions 151 and 153 are disposed to alternate with and be spaced apart from the first extension portions 141 and 143 in the X direction so as to form an interdigitated structure.

Here, among the second extension portions, a second extension portion 153 positioned at a right outermost portion in the X direction may serve as a second terminal connected to an external device such as a board, or the like.

The second frame 150 as described above may be formed of a conductive paste containing a conductive metal.

Here, the conductive metal may be, for example, nickel (Ni), copper (Cu), palladium (Pd), gold (Au) or an alloy thereof. However, the conductive metal is not limited thereto.

In this case, a nickel (Ni)/tin (Sn) plating layer or a gold (Au) plating layer may be formed on a surface of the second frame 150.

The plurality of multilayer capacitors 101 may be disposed at a predetermined interval so that the first and second band portions 131b and 132b of the first and second external electrodes 131 and 132 may be adhered to the first and second extension portions adjacent to each other, respectively.

Here, a conductive adhesive may be interposed between the first band portion 131b of the first external electrode 131 of the multilayer capacitor 101 and the first extension portions 141 and 143 of the first frame 140 and between the second band portion 132b of the second external electrode 132 and the second extension portions 151 and 153 of the second frame 150, respectively.

The conductive adhesive may be, for example, solder, a conductive epoxy, or the like.

Further, the plurality of multilayer capacitors 101 may be disposed in two layers to face each other in the Z direction with the first and second frames 140 and 150 interposed therebetween.

In addition, a sealing part 160 formed to cover the plurality of multilayer capacitors 101 may be further included.

The sealing part 160 as described above may be formed of, for example, an epoxy molding compound (EMC) or a resin.

Therefore, the sealing part 160 may protect the multilayer capacitors 101 included in the electronic component 100 from external impacts and impart exothermic characteristics or water repellent characteristics to a product.

Further, the sealing part may be formed so that the first and second frames are not formed on portions diagonally opposing each other in both surfaces of the sealing part 160 in the X direction.

Here, as illustrated in FIG. 4, the first extension portion positioned at the left outermost portion in the first frame 140 in the X direction may be bent along side and lower surfaces of the sealing part 160 to thereby become a first terminal 141', and the second extension portion positioned at the right outermost portion in the second frame 150 in the X direction may be bent along the side and lower surfaces of the sealing part 160 to thereby become a second terminal 151'.

Further, the first and second terminals 141' and 151' may be spaced apart from the sealing part 160, such that the first and second terminals 141' and 151' may more suitably absorb bending impact of a board, thereby improving bending strength of a product.

Hereinafter, a method of manufacturing the electronic component according to the present disclosure will be described.

First, as illustrated in FIG. 5, the first and second frames 140 and 150 for being used as the terminals, respectively, may be disposed so that the first extension portions 141 and 143 and the second extension portions 151 and 153 are spaced apart from each other and alternately disposed with each other.

In this case, nickel (Ni)/tin (Sn) plating or gold (Au) plating may be performed on surfaces of the first and second frames 140 and 150.

Next, as illustrated in FIG. 6, a plurality of multilayer capacitors 101 may be disposed in parallel with each other and separated by a predetermined interval on the first extension portions 141 and 143 and the second extension portions 151 and 153 adjacent to each other. Here, the first external electrode 131 of the multilayer ceramic capacitor 101 may be adhered to one of the first extension portions 141 and 143, and the second external electrode 132 may be adhered to one of the second extension portions 151 and 153.

Next, as illustrated in FIG. 7, a structure in which the plurality of multilayer capacitors 101 are adhered to the first and second frames 140 and 150 may be subjected to a reflow process or thermal treatment using an oven, or the like, to thereby complete adhesion. Then, the resultant was overturned in the Z direction.

Next, as illustrated in FIG. 8, a plurality of multilayer capacitors 101 may be additionally disposed in parallel with each other by a predetermined interval on the first extension portions 141 and 143 and the second extension portions 151 and 153 adjacent to each other on rear surfaces of the first and second frames 140 and 150. Here, the first external electrode 131 of the multilayer ceramic capacitor 101 may be connected to one of the first extension portions 141 and 143, and the second external electrode 132 may be adhered to one of the second extension portions 151 and 153.

According to the structure as described above, the plurality of multilayer capacitors 101 may be stacked in two layers with the first and second frames 140 and 150 interposed therebetween.

Further, two multilayer capacitors 101 may be adhered to each other at positions facing each other with the first and second frames 140 and 150 interposed therebetween.

Next, as illustrated in FIGS. 9 and 10, the sealing part 160 may be formed by covering the plurality of multilayer capacitors 101 with EMC molding or resin coating.

Next, as illustrated in FIGS. 3 and 4, the first terminal 141' may be prepared by bending first extension portions 141a and 141b positioned at the left outermost portion of the first frame 140 exposed to the outside of the sealing part 160 along the side and lower surfaces of the sealing part 160, and the second terminal 151' may be prepared by bending second extension portions 151a and 151b positioned at the right outermost portion of the second frame 150 along the side and lower surfaces of the sealing part 160.

The first and second terminals 141' and 151' completed as described above may separate the sealing part 160 and a mounting portion of the electronic component mounted on a board, or the like, from each other, such that bending strength characteristics of the product may be improved.

In an existing method of stacking a multilayer capacitor, the multilayer capacitors are stacked only in one direction of longitudinal or transverse directions. Therefore, at the time of stacking several tens or several hundreds of multilayer capacitors, an electronic component may be formed to be elongated only in one direction, which may causes a problem at the time of mounting the electronic component on a board.

In the present disclosure, since the multilayer capacitors are stacked on the first and second frames connected in parallel to each other in longitudinal and transverse directions, the electronic component is not formed in a shape in which the electronic component is elongated in only one direction but may be formed in a shape close to a tetragon, thereby imparting mounting stability of the electronic component.

Therefore, the electronic component according to the present disclosure may be used to replace an existing electrolytic capacitor and an existing film capacitor in electric/industrial products requiring a high temperature and high capacitance.

As set forth above, according to exemplary embodiments in the present disclosure, stability may be improved by stacking and attaching the plurality of multilayer capacitors to the first and second frames connected in parallel to each other in the longitudinal and transverse directions in a shape close to a tetragon to constitute a single product.

While exemplary embodiments have been shown and described above, it will be apparent to those skilled in the art that modifications and variations could be made without departing from the scope of the present invention as defined by the appended claims.

What is claimed is:

1. An electronic component, comprising:
   a first frame having a comb-tooth structure including a first elongate support member extending along a first direction and at least two first extension members spaced apart from each other, the first extension members being elongate members extending in a second direction perpendicular the first direction;
   a second frame having a second comb-tooth structure including a second elongate support member extending along the first direction, spaced apart from and disposed parallel to the first elongate support member, and at least two second extension members spaced apart from each other, the second extension members being elongate members extending in the third direction opposing the second direction; and
   capacitors, each having a first external electrode and a second external electrode, disposed apart from each other such that the first external electrode of each of the capacitors directly contacts one of the first extension members and the second external electrode of each of the capacitors directly contacts one of the second extension members, wherein the comb-tooth structure of the first frame and the second comb-tooth structure of the second frame are interdigitated such that one of the first extension members and the second extension members are spaced apart and parallel to each other, and a distance between a first pair of first and second extension members adjacent to each other is different from a distance between a second pair of the first and second extension members adjacent to each other, the second pair being adjacent to the first pair.

2. The electronic component of claim 1, wherein each of the capacitors is a multilayer capacitor.

3. The electronic component of claim 1, wherein each of the first and the second frames has a first surface and a second surface opposite the first surface, and capacitors are disposed on each of the first and second surfaces.

4. The electronic component of claim 1, further comprising a sealing part covering the capacitors.

5. The electronic component of claim 1, wherein an outermost of the first extension members, and a farthest of the second extension members in the first direction from the outermost of the first extension members respective form a first and a second terminal of the electronic component.

6. An electronic component, comprising
a first comb-tooth frame and a second comb-tooth frame disposed to be opposing and spaced apart from the first comb-tooth frame to form an interdigitated structure, prongs of each of the first comb-tooth frame and the second comb-tooth frame extending in a single direction; and
capacitors, each having a first external electrode and a second external electrode, disposed on the interdigitated structure such that the first external electrode of each of the capacitors is disposed to directly contact the prongs of the first comb-tooth frame and the second external electrode of each of the capacitors is disposed to directly contact the prongs of the second comb-tooth frame,
wherein an outermost prong of the first comb-tooth frame forms a first terminal for the first frame and an outermost prong of the second comb-tooth frame forms a second terminal for the second frame
wherein each of the first and second frames has a first surface and a second surface opposing the first surface, and capacitors are disposed on each of the first and the second surfaces.

* * * * *